United States Patent
Tokumasu et al.

[11] Patent Number: 6,110,814
[45] Date of Patent: Aug. 29, 2000

[54] FILM FORMING METHOD AND SEMICONDUCTOR DEVICE MANUFACTURING METHOD

[75] Inventors: Noboru Tokumasu; Kazuo Maeda, both of Tokyo, Japan

[73] Assignees: Canon Sales Co., Inc.; Semiconductor Process Laboratory Co., Ltd., both of Japan

[21] Appl. No.: 09/330,052

[22] Filed: Jun. 11, 1999

[30] Foreign Application Priority Data

Apr. 12, 1998 [JP] Japan .................................. 10-346064

[51] Int. Cl.$^7$ ................................................. H01L 21/4763
[52] U.S. Cl. ........................ 438/597; 438/784; 438/789; 438/790
[58] Field of Search .................................. 438/623, 632, 438/783, 784, 788, 789, 790

[56] References Cited

U.S. PATENT DOCUMENTS

| | | | |
|---|---|---|---|
| 5,028,566 | 7/1991 | Lagendijk | 438/784 |
| 5,262,358 | 11/1993 | Sigmund et al. | 438/781 |
| 5,319,247 | 6/1994 | Matsuura | 257/760 |
| 5,459,105 | 10/1995 | Matsuura | 438/699 |
| 5,721,156 | 2/1998 | Matsuura | 438/699 |
| 5,772,716 | 6/1998 | Krohm et al. | 65/60.2 |
| 5,776,236 | 6/1999 | Neuman et al. | 106/287.17 |
| 5,915,200 | 6/1999 | Tokumasu et al. | 438/623 |

*Primary Examiner*—John F. Niebling
*Assistant Examiner*—Lynne A. Gurley
*Attorney, Agent, or Firm*—Lorusso & Loud

[57] ABSTRACT

The present invention relates to a film forming method for forming a planarized interlayer insulating film to cover wiring layers, etc. of a semiconductor integrated circuit device. The method includes the steps of forming on a substrate 206, a phosphorus-containing insulating film 45a containing $P_2O_3$ by using a film forming gas in which an oxidizing gas is added into a gas mixture including a phosphorus-containing compound, which has III valence phosphorus and in which oxygen is bonded to at least one bond of the III valence phosphorus, and silicon-containing compound, or by using the film forming gas from which the oxidizing gas removed, heating the phosphorus-containing insulating film 45a while applying acceleration to the insulating film 45a to fluidize the insulating film and thus planarize a surface of the insulating film 45b while the insulating film 45a has a predetermined viscosity, and heating further the insulating film 45b after the surface of the insulating film 45b has been planarized, to sublimate $P_2O_3$ in the insulating film 45b and thus solidify the insulating film 45b.

17 Claims, 11 Drawing Sheets

Film Formation (Plasma)

Heating in the Planarizing Process

Rotating Means

Ultrasonic Applying Means

TEOS + SOP - 11(b) + TMB or TEB + O3 (Heating) or
TEOS + TMP + TMB or TEB (Plasma)

Heating in the Planarizing Process

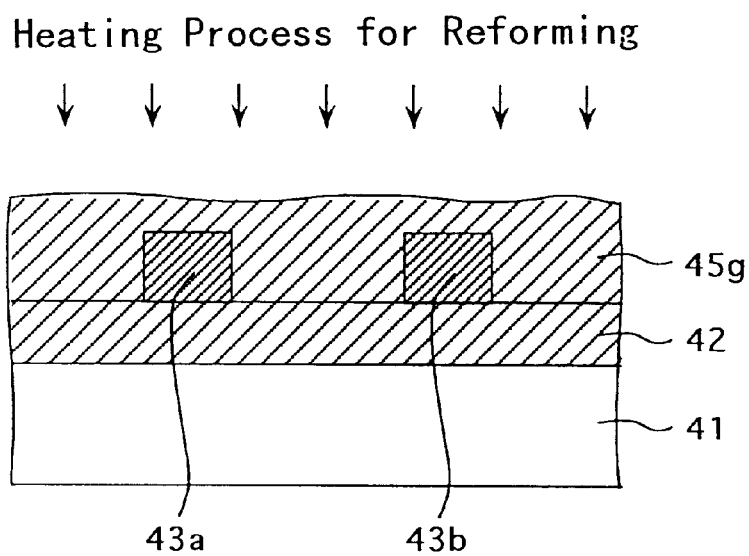

FILM FORMING METHOD AND SEMICONDUCTOR DEVICE MANUFACTURING METHOD

BACKGROUND OF THE INVENTION

1. Field of the Invention

The present invention relates to a film forming method for forming a planarized interlayer insulating film to cover wiring layers, etc. of a semiconductor integrated circuit device, and a semiconductor device manufacturing method using such film forming method.

2. Description of the Prior Art

In recent years, in the field of the semiconductor integrated circuit device, a higher integration density is proceeded and the case where a multi-layered wiring extending to several layers or more is formed is increased. In this case, since especially aluminum material is often employed as a material of the wiring layer, a film forming method which makes it possible to form a planarized interlayer insulating film at the low temperature of less than 500° C. is earnestly requested.

In the planarizing method by using the heating/fluidizing process, perfect filling of the interlayer insulating film can be expected because thermal fluidability is employed. At present, especially the BPSG (Boronphosphosilicate Glass) film is often used in such application. But the heating at the temperature of 850° C., even if the lowest temperature is selected, is needed to fluidize the BPSG film. Therefore, the BPSG film cannot be applied to the applications as the underlying layer of the wiring layer and the interlayer insulating film, both being requested to be formed at the low temperature, especially the application as the insulating film covering the aluminum wiring layer.

In this case, the fluidization temperature can be lowered to some extent by increasing the phosphorus or boron concentration. However, such fluidization temperature is not enough and in addition such a new problem is caused that stability and moisture resistance of the insulating film is reduced. Since the substantially same fluidization temperature as that in the BPSG film is needed for the PSG (Phosphosilicate Glass) film, the above problem is similarly caused.

Also, as the insulating film having the low fluidization temperature, the GeBPSG film in which $GeO_2$ is added to the BPSG film has been developed. But the fluidization temperature can be merely lowered to about 750° C. at best, and thus it is difficult to apply the GeBPSG film to the underlying film and the interlayer insulating film for which the low temperature treatment is requested.

For this reason, in Patent Application Publication (KOKAI) Hei 10-135203, etc., the film forming method which enables to form the planarized insulating film by lowering the fluidization temperature has been disclosed. The film forming method will be explained in the following.

First, as shown in FIG. 1A, the film-depositing substrate 101 (hereinafter merely referred to as substrate 101 as the case demands) is loaded into the chamber of the plasma CVD equipment or the thermal CVD equipment. Then, in the case of the thermal CVD equipment, the substrate heating is effected and then held at the predetermined substrate temperature. In this case, in the substrate 101, the underlying insulating film 2 made of the silicon oxide film, etc., for example, is formed on the silicon substrate (semiconductor substrate) 1 and then the wiring layers 3a, 3b made of the aluminum film, etc., for example, are formed on the underlying insulating film 2.

Then, as shown in FIG. 1B, the gas mixture consisting of the phosphorus containing compound, which has III valence phosphorus and in which oxygen is bonded to at least one bond of the III valence phosphorus, the silicon containing compound, and the oxidizing gas is prepared as the film forming gas. This film forming gas is introduced into the chamber and plasmanized, and held for a predetermined time. Accordingly, the PSG film 5 of predetermined thickness, which contains high density of $P_2O_3$, can be formed. At this time, according to the density of $P_2O_3$ and the rate of $P_2O_3/P_2O_5$, sometimes the PSG film 5 is fluidized at the substrate temperature during film formation. In this case, the planarization can be achieved simultaneously with the film formation.

If not so, as shown in FIG. 1C, after the PSG film 5 has been formed on the substrate 101, the heating process is executed separately to fluidize the PSG film 5 and thus planarize a surface of the PSG film 5. In this case, since the PSG film 5a having the high density of $P_2O_3$ is formed as a phosphorus component, the fluidization temperature can be lowered widely to less than 500° C. Therefore, such PSG film 5a can be utilized as the interlayer insulating film covering the aluminum wiring.

By the way, since $P_2O_3$ itself can react easily with the moisture, the PSG film 5a absorbs the moisture if the PSG film 5a is picked out into the air in the above steps, e.g., when the process is switched from the film forming step of the PSG film 5a to the planarizing process step, or if the PSG film 5a is taken out into the air after the film formation, whereby reduction in film quality of the PSG film is brought about.

Therefore, in order to utilize the PSG film 5a as the interlayer insulating film of the semiconductor device, etc., the PSG film 5a must be stabilized such that the moisture absorption of the PSG film 5a should be prevented in the middle of the film forming steps of the PSG film 5a and also after the PSG film 5a has been formed.

SUMMARY OF THE INVENTION

It is an object of the present invention to provide a film forming method capable of forming a phosphorus-containing insulating film, which has small hygroscopic property and improved film quality and a surface of which is planarized, by executing a series of steps of film formation, planarization of the formed film, and improvement in quality of the formed film while preventing moisture absorption, and a semiconductor device manufacturing method using such film forming method.

A gist of the present invention will be explained hereinafter.

According to the above film forming method, there are provided the step of heating the phosphorus containing insulating film while applying the acceleration to the phosphorus containing insulating film to fluidize and thus planarize the phosphorus containing insulating film while the phosphorus containing insulating film has a predetermined viscosity after the phosphorus containing insulating film has been formed, and the step of further heating the phosphorus containing insulating film to sublimate $P_2O_3$ in the phosphorus containing insulating film and thus solidify the phosphorus containing insulating film after the phosphorus containing insulating film has been planarized.

Even when shrinkage of the phosphorus containing insulating film is caused due to sublimation of $P_2O_3$ caused by heating the phosphorus containing insulating film during the planarization, the fluidability of the phosphorus containing insulating film can be enhanced by applying the acceleration in planarization and therefore the planarized surface of the phosphorus containing insulating film can be maintained.

Therefore, it is possible to form the phosphorus containing insulating film which has the small hygroscopic property and the improved film quality and the surface of which is planarized.

Further, since the fluidability of the phosphorus containing insulating film can be enhanced, the phosphorus containing insulating film can be filled in minute clearances on the substrate without remaining unfilled area. Therefore, voids can be prevented from being generated and also film quality of the phosphorus containing insulating film can be improved.

In this case, a temperature at which a surface of the phosphorus-containing insulating film is planarized by heating the phosphorus-containing insulating film to fluidize is set lower than a temperature at which the phosphorus-containing insulating film is solidified by heating the phosphorus-containing insulating film to sublimate $P_2O_3$ in the phosphorus-containing insulating film, and so-called stepwise heating (step heating) steps are adopted as a series of heating operations ranging from the planarizing process to the film quality improvement. Following advantageous merits can be achieved by executing such step heating.

That is, in case the film forming gas containing the phosphorus containing compound which has III valence phosphorus and in which oxygen is bonded to at least one bond of the III valence phosphorus is employed, a deal of $P_2O_3$ is contained in the formed phosphorus containing insulating film. However, since shrinkage/solidification of the phosphorus containing insulating film is caused because of the sublimation of $P_2O_3$ caused by the heating in the planarizing process, unevenness appears once again on the surface, which has been flat in the middle of the planarizing process, after the planarizing process has been completed. On the contrary, if the heating temperature in the planarizing process is set lower, an amount of $P_2O_3$ sublimation can be reduced during the planarizing process so as to suppress the sublimation of $P_2O_3$ which can prevent the solidification of the phosphorus containing insulating film. Accordingly, since the phosphorus containing insulating film can be kept at its low viscosity state, the flat surface of the phosphorus containing insulating film can be maintained continuously by keeping a fluidized state of the phosphorus containing insulating film.

Therefore, if the $P_2O_3$ is sublimated by heating finally the insulating film at the high temperature, the sufficient fluidability of the phosphorus containing insulating film can still be maintained since the volume of $P_2O_3$ is larger at the initial stage of the heating process to sublimate the $P_2O_3$. Therefore, the flat surface can be maintained even when the film thickness is reduced because of shrinkage of the phosphorus containing insulating film. Then, when the $P_2O_3$ in the phosphorus containing insulating film is reduced to a predetermined amount after the sublimation of the $P_2O_3$, the phosphorus containing insulating film can be solidified with maintaining its flat surface state.

As stated above, since the sublimation of $P_2O_3$ can be gradually generated by carrying out the step heating to thus suppress the solidification of the phosphorus containing insulating film, $P_2O_3$ causing the hygroscopic property can be sublimated from the phosphorus containing insulating film while maintaining the flat surface of the phosphorus containing insulating film.

In addition, if the $P_2O_3$ left in the phosphorus containing insulating film is changed into $P_2O_5$ by heating the phosphorus containing insulating film in an atmosphere containing the oxygen after the phosphorus containing insulating film has been solidified by sublimating $P_2O_3$ in the phosphorus containing insulating film, the $P_2O_3$ causing hygroscopic property can be completely disappeared from the phosphorus containing insulating film.

BRIEF DESCRIPTION OF THE DRAWINGS

FIGS. 11A to 11D are sectional views showing a PSG film forming method according to the third embodiment of the present invention.

DESCRIPTION OF THE PREFERRED EMBODIMENTS

Embodiments of the present invention will be explained in detail with reference to the accompanying drawings hereinafter.

(1) First Embodiment

A film forming equipment 301 for carrying out a method of forming a PSG film, which is formed by a thermal CVD method or a plasma excitation CVD method and then planarized, according to a first embodiment of the present invention will be explained with reference to FIGS. 2 to 5 hereunder.

Figure 1A:
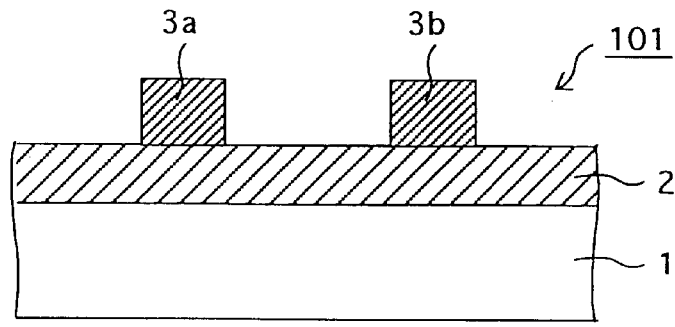
FIGS. 1A to 1C are sectional views showing a PSG film forming method according to an example in the prior art.
Figure 1B:
Figure 1B:
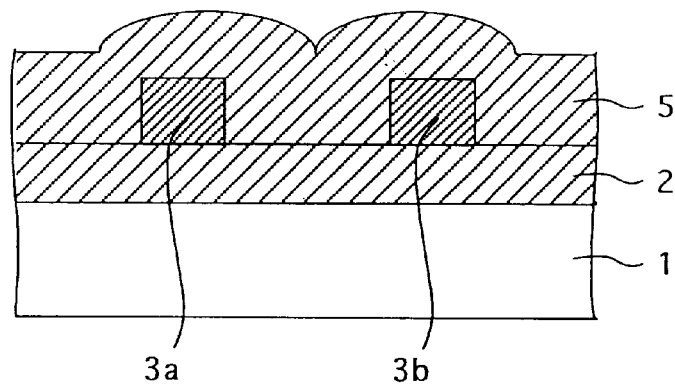
Figure 1C:
Figure 1C:
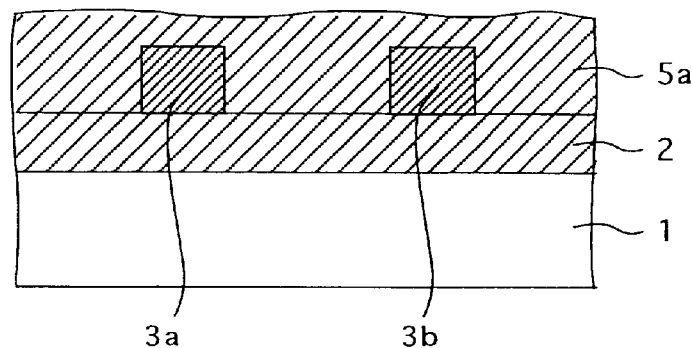
Figure 2:
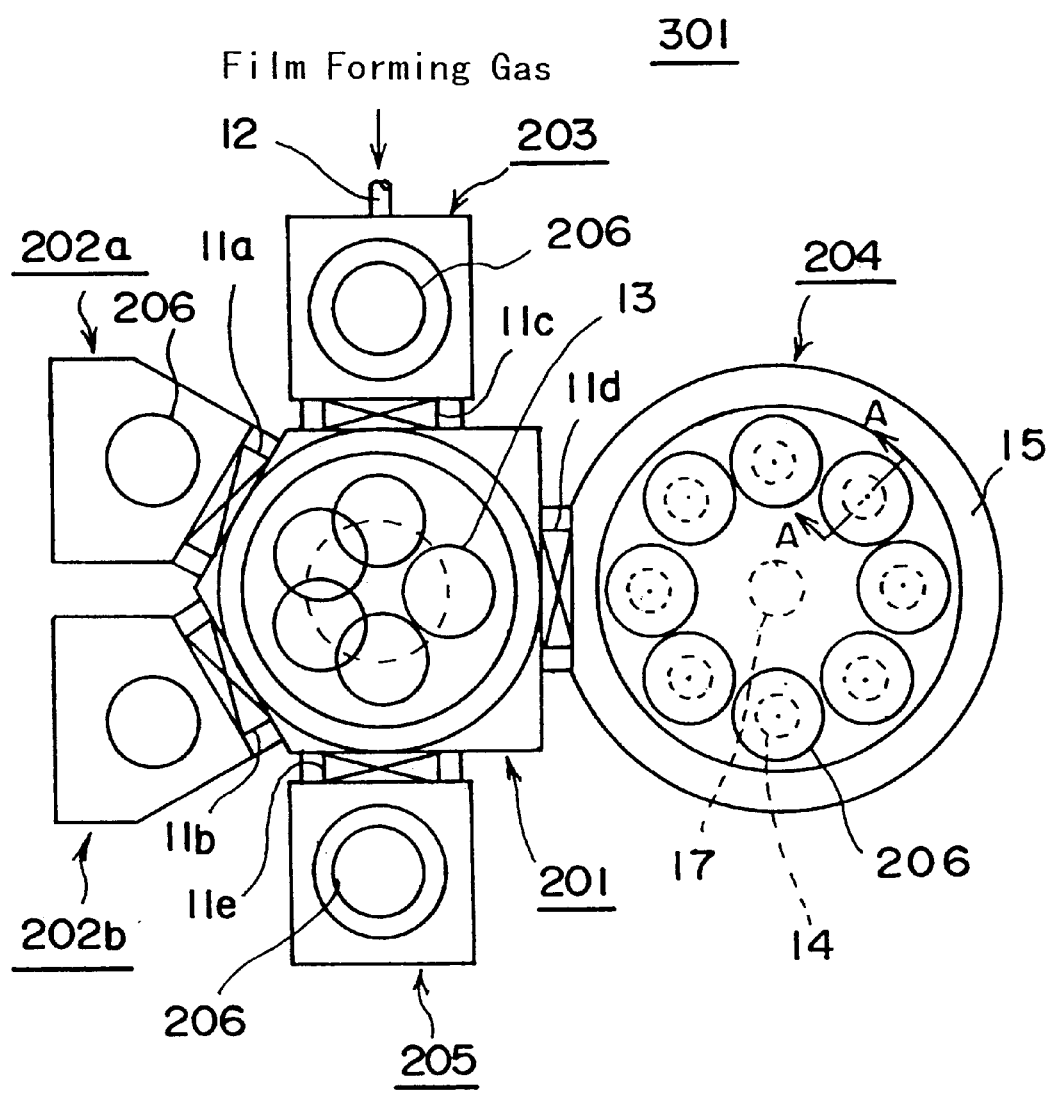
FIG. 2 is a top view showing a film forming equipment employed in a PSG film forming method according to a first embodiment of the present invention.

As shown in FIG. 2, a configuration of the film forming equipment 301 employed in the first embodiment of the present invention is constructed by connecting pressure-reducible load lock chambers 202a, 202b, a pressure-reducible film forming chamber 203, a pressure-reducible planarizing process chamber 204, and a pressure-reducible substrate cooling chamber 205 to a pressure-reducible transfer chamber 201 respectively. A film-depositing substrate 206 (hereinafter merely referred to as substrate 206 as the case demands) is stored temporarily in the load lock chambers 202a, 202b when such substrate 206 is loaded into the film forming equipment 301 from the external side or unloaded from the film forming equipment 301 to the external side. A phosphorus-containing insulating film is formed on the substrate 206 in the film forming chamber 203. Processes of fluidizing of the phosphorus-containing insulating film and planarizing such film are executed in the planarizing process chamber 204. The substrates 206 are stored temporarily in the substrate cooling chamber 205 before/after the film forming process and before/after the planarizing process.

Then, opening/closing doors 11a to 11e which partition the above chambers and thus enable to lower independently their internal pressures are provided between the transfer chamber 201 and other chambers 202a, 202b, 203, 204, 205. When the substrates 206 are loaded or unloaded through mutual chambers, such mutual chambers can be communicated with each other by opening the opening/closing doors 11a to 11e. In contrast, when the pressures in respective chambers are lowered independently, mutual communications between respective chambers are isolated by closing the opening/closing doors 11a to 11e.

A transfer robot 13 which is able to unload the substrate 206 from the selected chamber 202a, 202b, 203, 204, or 205 and then load the substrate 206 into other selected chamber 202a, 202b, 203, 204, or 205 is provided in the transfer chamber 201.

If the film formation is conducted by the plasma enhanced CVD method in the film forming chamber 203, parallel-plate type paired electrodes one electrode of which serves as a loading table for the substrate 206 are equipped in the film forming chamber 203. Then, an RF power supply which can supply a high frequency power of a frequency of 13.56 MHz is connected to the another electrode which does not serve as the loading table for the substrate 206. If the film formation is conducted by the thermal CVD method, a heating means for activating a film forming gas thermally is provided in the film forming chamber 203 in place of the electrodes being employed to plasmanize the film forming gas. As the heating means, either a resistance heating heater which is built in the substrate loading table or an infrared heater which is provided over the substrate loading table may be employed.

Figure 3:
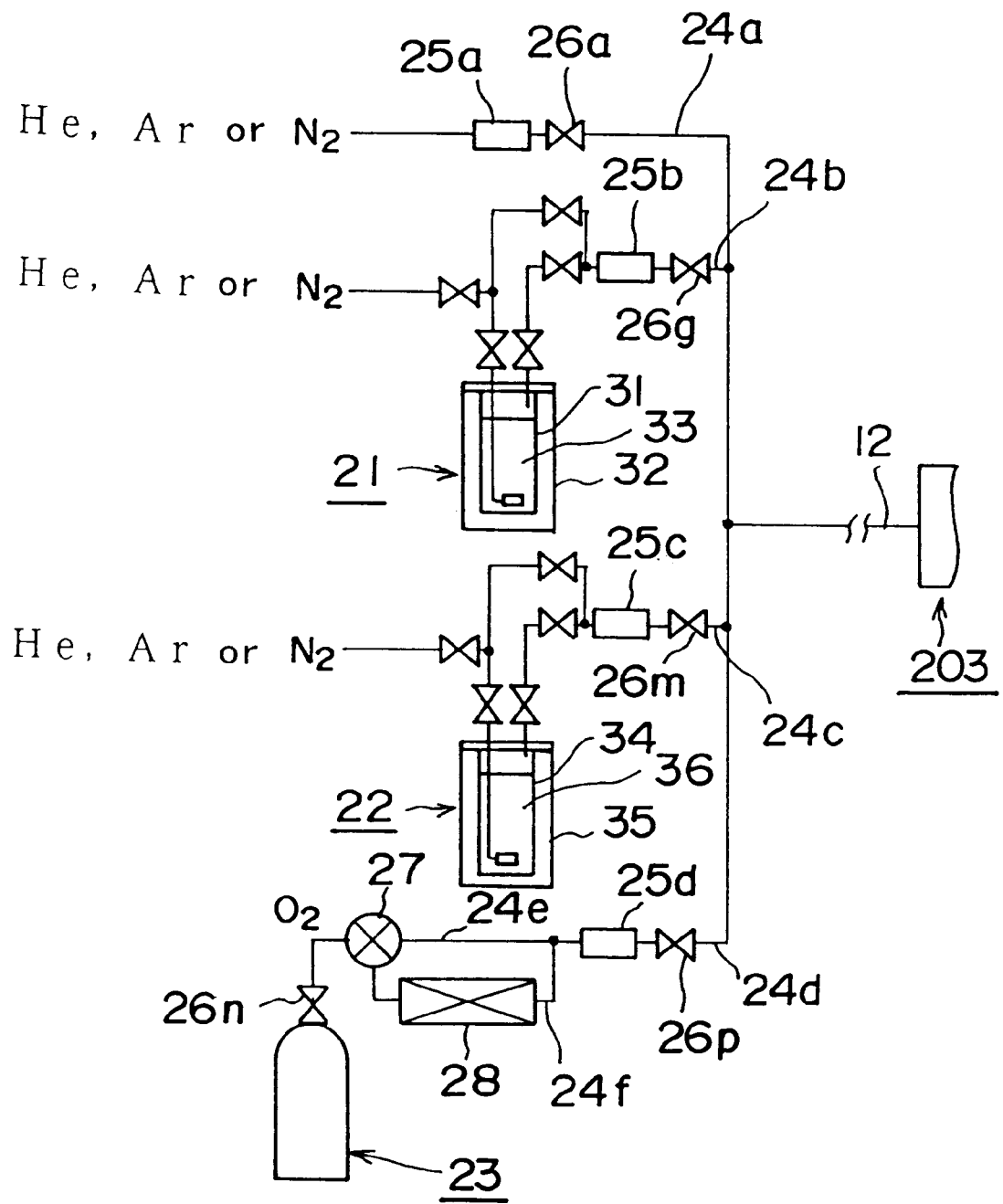
FIG. 3 is a view showing a film forming gas supplying means of the film forming equipment employed in the PSG film forming method according to the first embodiment of the present invention.

As shown in FIG. 3, a first source supplying device 21 for supplying a source of a phosphorus-containing compound 33, a second source supplying device 22 for supplying a source of silicon-containing compound 36, and a third source supplying device 23 for supplying a source of an oxidizing gas are connected to the film forming chamber 203. Then, respective source gases are introduced to a film forming gas introducing port 12 of the film forming chamber 203 via respective flow paths 24a to 24d for introducing the source gases respectively. In this case, a compound which has III valence phosphorus and in which oxygen is bonded to at least one bond of the III valence phosphorus may be employed as the phosphorus-containing compound 33. The first source supplying device 21 for the phosphorus-containing compound 33 has a source storage container 31 and a source temperature adjusting means 32. The phosphorus-containing compound 33 is heated or cooled to a predetermined temperature by the source temperature adjusting means 32 surrounding the source storage container 31. Similarly the second source supplying device 22 for the silicon-containing compound 36 has a source storage container 34 and a source temperature adjusting means 35. The silicon-containing compound 36 is also heated or cooled into a predetermined temperature by the source temperature adjusting means 35 surrounding the source storage container 34.

The phosphorus-containing compound 33 and the silicon-containing compound 36 are employed as a liquid source in many cases, and thus they are contained in the source storage containers 31, 34 respectively. The phosphorus-containing compound 33 and the silicon-containing compound 36 are contained in a carrier gas ($N_2$ or Ar) by bubbling these liquid sources by the carrier gas, and then such carrier gas is supplied to the film forming chamber 203.

As phosphorus-containing compound 33, TMP (Trimethylphosphite ($P(OCH_3)_3$)) whose constitutional formula is given by

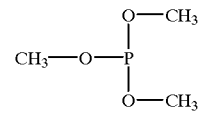

(Formula 1)

or a phosphorus-containing compound which has a Si—O—P structure, e.g., phosphorous acid dimethyl trimethylsilylester (referred to as "SOP-11(a)" hereinafter) whose constitutional formula is given by

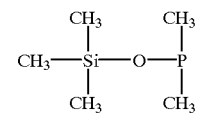

(Formula 2)

or phosphorous acid dimethoxy trimethylsilylester (referred to as "SOP-11(b)" hereinafter) whose constitutional formula is given by

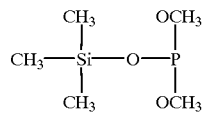

(Formula 3)

In addition to the above, another phosphorus-containing compound which has III valence phosphorus and in which oxygen is bonded to at least one bond of the III valence phosphorus may be employed.

As the silicon-containing compound 36, alkylsilane or allylsilane (general formula: $R_nSiH_{4-n}$ (n=1 to 4)), alkoxysilane (general formula: $(RO)_nSiH_{4-n}$ (n=1 to 4)), chain siloxane (general formula: $R_nH_{3-n}SiO(R_kH_{2-k}SiO)_mSiH_{3-n}R_n$ (n=1 to 3; k=0 to 2; m≧0)), derivative of chain siloxane (general formula: $(RO)_nH_{3-n}SiOSiH_{3-n}(OR)_n$ (n=1 to 3)), ring siloxane (general formula: $(R_kH_{2-k}SiO)_m$ (k=1, 2; m≧0)), etc. may be employed. In above chemical formulae, R denotes alkyl radical, allyl radical, or their derivative. Also, k, m, n are zero or a positive integer respectively.

In addition, ozone ($O_3$), oxygen ($O_2$), NO, $N_2O$, $NO_2$, CO, $CO_2$, $H_2O$, or the like may be employed an oxidizing gas. If the ozone is used as the oxidizing gas, the oxygen which is supplied from the third source supplying device 23 in which the oxygen is contained is introduced to an ozonizer 28 via a transfer switch 27, and then a part of the oxygen is converted to the ozone by the ozonizer 28. In this case, an ozone density means the ozone content in the oxygen.

Valves 26a to 26p which open or close flow paths 24a to 24d are provided to source gas flow paths 24a to 24d, and gases necessary for formation of various films can be selected by operating these valves 26a to 26p. Also, flow rates of the source gases which pass through the flow paths 24a to 24d can be adjusted by mass flow controllers 25a to 25d which are provided to the flow paths 24a to 24d.

Figure 4:
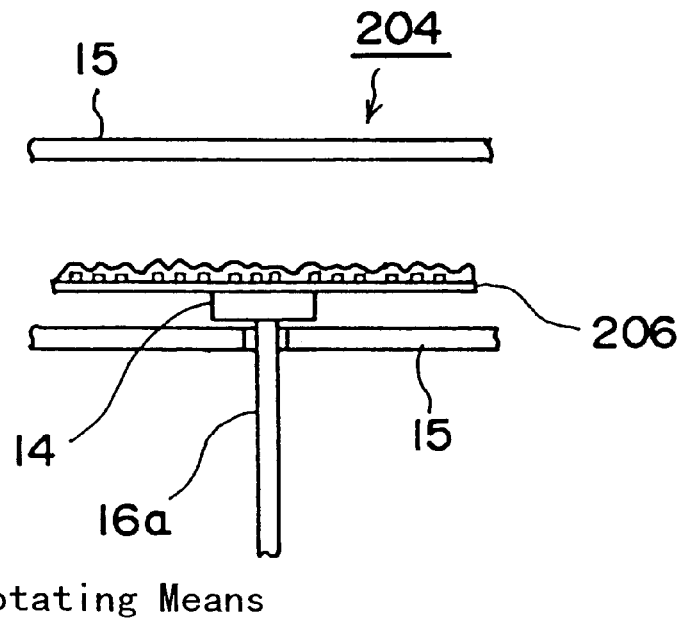
FIG. 4 is a side view showing an acceleration applying means of the film forming equipment employed in the PSG film forming method according to the first embodiment of the present invention.
Figure 5:
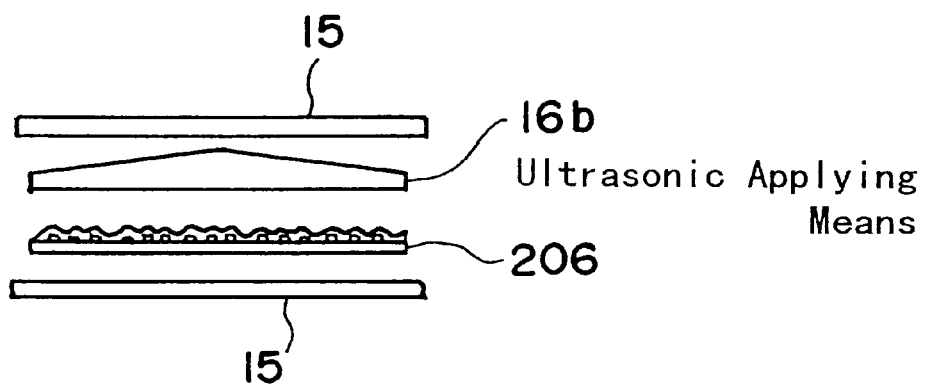
FIG. 5 is a side view showing another acceleration applying means of the film forming equipment employed in the PSG film forming method according to the first embodiment of the present invention.

Substrate loading tables 14 are provided in the planarizing process chamber 204 at eight locations along a circumference in the neighborhood to a partition wall 15 of the planarizing process chamber 204. Each of the substrate loading tables 14 has a heating means (not shown) for fluidizing the phosphorus-containing insulating film on the substrate 206 to planarize, and a acceleration applying means 16a or 16b. The heating means and the acceleration applying means 16a or 16b may be provided to every substrate loading table 14, or only one heating means and one acceleration applying means 16a or 16b may be provided to an overall planarizing process chamber 204. As the heating means, either the resistance heating heater which is built in the substrate loading table 14 or the infrared heater which is provided over the substrate loading table 14 may be employed. As the acceleration applying means, for example, a rotating means 16a shown in FIG. 4 or a ultrasonic applying means 16b shown in FIG. 5 may be employed. In this first embodiment, the substrate loading table 14 which rotates around a rotation axis 16a is employed. FIGS. 4 and 5 are side views, when viewed from a line A—A in FIG. 2, showing an acceleration applying means of the film forming equipment respectively, and showing respectively a state that the formed film is present on the substrate 206.

In addition, a substrate carrying tool which can rotate intermittently (stepwise) around a rotation axis 17 to make a round of the substrate loading tables 14 in sequence is installed in a center area of the planarizing process chamber 204. Although only the rotation axis 17 of the substrate carrying tool is illustrated, a rotating part whose eight arms extend from a center portion radially to correspond to the installed areas of the substrate loading tables 14 and whose center portions is fitted to the rotation axis 17 may be employed as other constituent part, for example. A vacuum chuck for holding the substrate 206, etc. is provided to a top end of the arm.

The substrate carrying tool receives the substrate 206 from the transfer robot 13 in the transfer chamber 201, then holds it, and then rotates to carry the substrate 206 to the desired substrate loading table 14.

Then, the film forming method using this film forming equipment 301 will be explained hereunder.

In this first embodiment, a gas mixture of the phosphorus-containing compound 33, the silicon-containing compound 36, and the oxidizing gas is employed as the film forming gas. The SOP-11(b) is used as the phosphorus-containing compound 33, and HMDSO (Hexamethyldisiloxane) is used as the silicon-containing compound 36, and the oxygen ($O_2$) is used as the oxidizing gas. HMDSO is cooled to the temperature of 10° C. and SOP-11(b) is heated to the temperature of 45° C. Since HMDSO and SOP-11(b) are in a liquid state at that temperature respectively, they are contained in the carrier gas by bubbling them by the carrier gas ($N_2$ or Ar). Contents of HMDSO and SOP-11(b) are adjusted by controlling the flow rate of the carrier gas.

Figure 6A:
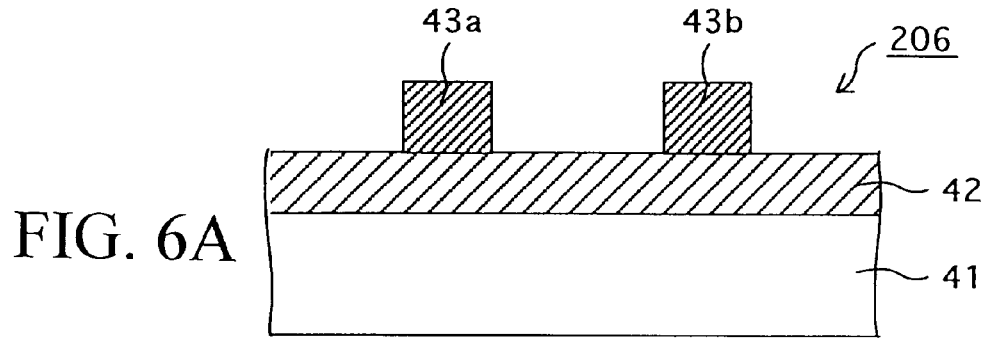
FIGS. 6A to 6C are sectional views showing a PSG film forming method according to the first embodiment of the present invention.

In this film forming method, at first the substrate 206 shown in FIG. 6A is loaded into the load lock chamber 202a of the film forming equipment 301. In this case, as shown in FIG. 6A, in the substrate 206, an underlying insulating film 42 such as a silicon oxide film, etc., for example, is formed on a silicon substrate (semiconductor substrate) 41 and then wiring layers 43a, 43b formed of an aluminum film, etc., for example, are formed on the underlying insulating film 42.

An inside of the load lock chamber 202a is opened into an atmospheric pressure during loading the substrate 206. Then, the pressure of the inside of the load lock chamber 202a is reduced after the loading operation. At this time, the pressure of the transfer chamber 201 is also reduced to the almost same extent as that of the load lock chamber 202a.

Then, the substrate 206 is unloaded from the load lock chamber 202a by the transfer robot 13, and then loaded into the transfer chamber 201.

Then, the substrate 206 is unloaded from the transfer chamber 201 by the transfer robot 13 being installed in the transfer chamber 201, and then loaded into the film forming chamber 203. In the film forming chamber 203, a PSG film (phosphorus-containing insulating film) 45a is formed as described in the following.

Figure 6B:
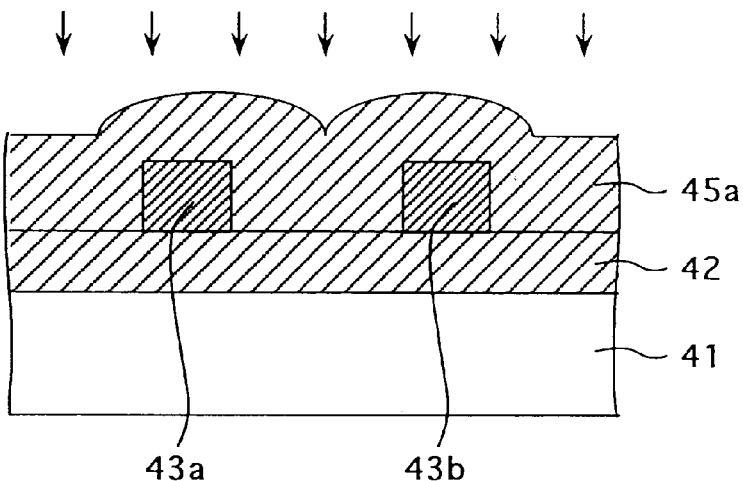

To begin with, the substrate 206 is heated up to a predetermined temperature and is kept at that temperature. Then, as shown in FIG. 6B, the above film forming gas is introduced into the film forming chamber 203, then plasmanized under film forming conditions which are set as given in Table 1, and then kept for a predetermined time as it is. As a result, the PSG film 45 which contains high density of $P_2O_3$ and has a predetermined film thickness is formed.

TABLE 1

Substrate temperature: 150 to 250° C.
Gas pressure: 2 to 10 Torr
Flow rate of SOP-11(b) bubbling gas ($N_2$ or Ar):
300 to 800 sccm (SOP-11(b) source temperature: 45° C.)
Flow rate of HMDSO bubbling gas ($N_2$ or Ar):
200 to 600 sccm (HMDSO source temperature: 10° C.)
Flow rate of oxidizing gas ($O_2$): below 15 sccm
RF power: 150 to 300 W
Frequency: 380 kHz to 2.45 GHz After the film formation has been completed, the substrate 206 is then unloaded from the film forming chamber 203 by the transfer robot 1 and then loaded into the transfer chamber 201.

The substrate 206 is then unloaded from the transfer chamber 201 by the transfer robot 1 and then loaded into the planarizing process chamber 204. Then, the substrate 206 is carried to the substrate loading tables 14 sequentially by the substrate carrying tool, and then is fixed onto the substrate loading tables 14 by the vacuum chuck, etc.

Figure 6C:
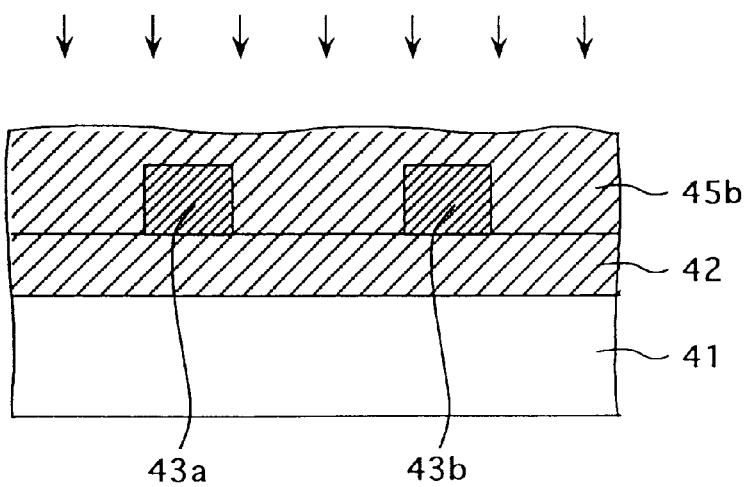

In turn, as shown in FIG. 6C the substrate 206 is heated in nitrogen, and the acceleration is applied to the PSG film 45a formed on the substrate 206 by rotating the substrate loading table 14 at the speed of rotation of about 1000 to 3000 rpm. At this time, the fluidization temperature of the PSG film (phosphorus-containing insulating film) 45b can be controlled according to a $P_2O_3$ density or a rate of $P_2O_3/P_2O_5$. Thus, the fluidization temperature of less than 700° C., preferably less than 500° C. can be achieved even when the acceleration is not applied to the PSG film 45a. Sufficient fluidability can be obtained at the lower temperature by applying the acceleration to the PSG film 45a. Otherwise, fluidability of the PSG film 45b can be enhanced at the temperature used normally when the acceleration is not applied to the PSG film 45a. As a result, the PSG film 45b can be filled in concave areas on the substrate 206 without remaining unfilled areas.

After the PSG film 45b has been planarized, $P_2O_3$ in the PSG film 45b is sublimated by still heating the PSG film 45b at the same temperature as that in the planarizing process, so that the PSG film 45b can be solidified.

If there is a possibility that $P_2O_3$ is left in the PSG film 45b after the PSG film 45b has been solidified, $P_2O_3$ in the PSG film 45b is sublimated by carrying out the annealing process in the $N_2$ or Ar gas atmosphere in the planarizing process chamber 204 to solidify the PSG film 45b, and then the PSG film 45b is annealed in the planarizing process chamber 204 after $N_2$ or Ar has been exchanged with $O_2$. As a result, $P_2O_3$ causing hygroscopic property can be disappeared removed from the PSG film 45b because $P_2O_3$ can be converted into $P_2O_5$, whereby film quality of the PSG film 45b can be improved much more.

After the planarizing process has been finished, the substrate 206 is then unloaded from the planarizing process chamber 204 by using the transfer robot 13 and then is loaded into the transfer chamber 201.

The substrate 206 is then unloaded from the transfer chamber 201, and is then loaded into the substrate cooling chamber 205 to be cooled therein. After cooling of the substrate 206 has been finished, the substrate 206 is then unloaded from the substrate cooling chamber 205 by using the transfer robot 13, and is then loaded into the transfer chamber 201.

The substrate 206 is then unloaded from the transfer chamber 201 by using the transfer robot 13, and is then loaded into the load lock chamber 202a whose pressure is reduced to the same extent as the transfer chamber 201. In turn, after the pressure of the load lock chamber 202a has been returned into the atmospheric pressure, the substrate 206 is unloaded from the load lock chamber 202a to the outside.

As described above, according to the film forming method of the first embodiment of the present invention, there are provided the step of heating the PSG film 45a while applying the acceleration to it to fluidize the PSG film 45a and thus planarize the PSG film 45a while the PSG film 45a has a predetermined viscosity after the PSG film 45a has been formed, and the step of further heating the PSG film 45a to sublimate $P_2O_3$ in the PSG film 45a and thus solidify the PSG film 45a after the PSG film 45a has been planarized.

The fluidability of the PSG film 45a can be enhanced by applying the acceleration in the planarizing process, so that surface planarization of the PSG film 45a can be still maintained even if shrinkage of the PSG film 45a is caused.

Thus, it is possible to form the PSG film 45a which has small hygroscopic property and improved film quality and a surface of which is planarized.

In addition, since the fluidability of the PSG film 45a can be enhanced, the PSG film 45a can be filled in minute clearances on the substrate 206 not to remain the unfilled area. Therefore, generation of voids can be prevented.

Second Embodiment

A method of forming the BPSG film containing $P_2O_3$ according to a second embodiment of the present invention will be explained with reference to FIGS. 7A to 7C hereunder.

Figure 7A:
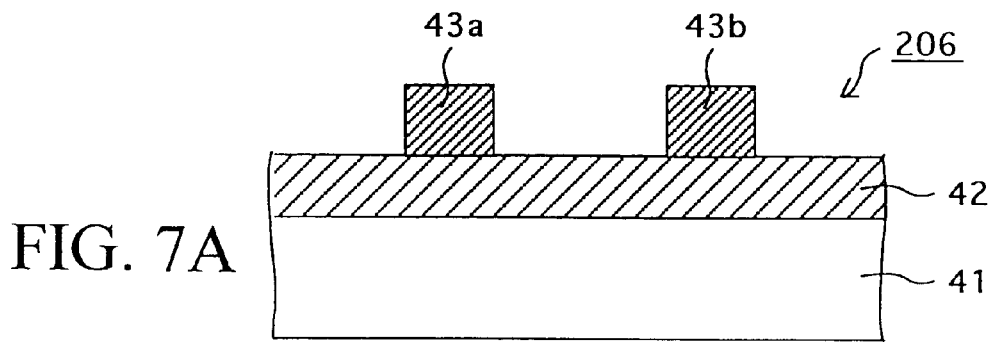
FIGS. 7A to 7C are sectional views showing a BPSG film forming method according to a second embodiment of the present invention.
Figure 7B:
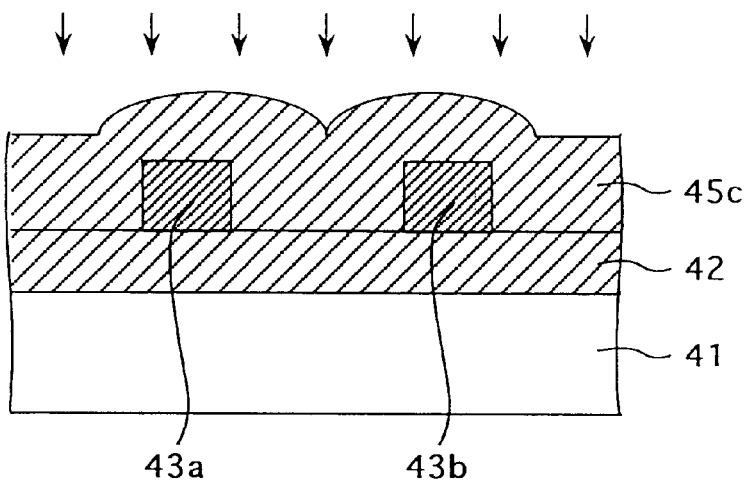

FIG. 7A is a sectional view showing the substrate 206 before films are formed thereon. Prior to the film formation, the substrate 206 has the same structure as that in FIG. 6A.

The BPSG film containing $P_2O_3$ is formed on the substrate 206 by the thermal CVD method or the plasma enhanced CVD method. In this case, in FIG. 7A, the same references as those shown in FIG. 6A are assigned to the same parts as those shown in FIG. 6A, and therefore their explanation will be omitted in this disclosure.

If the film is formed by the plasma enhanced CVD method, a gas mixture of TEOS (Tetraethylorthosilicate or Tetraethoxysilane)+TMP+TMB or TEB, for example, is employed as the film forming gas, and the film forming conditions can be set as shown in the following. In this case, the reaction gas such as SOP-11(b), etc. may be employed in place of TMP.

TABLE 2

<Film forming conditions (Plasma enhanced CVD method (including the ECR (Electron Cyclotron Resonance) method))>

Substrate temperature: 200 to 300° C.
Gas pressure in the chamber: 3 to 100 mm Torr
Flow rate of TEOS: 0.05 to 0.3 SLM
Flow rate of TMP: 0.05 to 0.5 SLM
Flow rate of TMB or TEB: 0.05 to 0.4 SLM
Applied power: 200 W to 1.5 kW
Frequency: 13.56 MHz
Substrate bias power: 100 to 300 W
Frequency: 13.56 MHz If the film is formed by the thermal CVD method, a gas mixture of TEOS+SOP-11(b)+TMB or TEB+$O_3$ or $O_2$, for example, is employed as the film forming gas, and the film forming conditions can be set as shown in the following. In this case, the reaction gas such as TMP, etc. may be employed in place of SOP-11(b).

TABLE 3

<Film forming conditions (Thermal CVD method)>

Substrate temperature: 200 to 300° C.
Ozone density: 0.3 to 2.5%
Gas pressure: 2 to 10 Torr
Flow rate of the SOP-11(b) gas: 0.1 to 1.5 SLM
Flow rate of TMB or TEB gas: 0.1 to 1.0 SLM With the above, as shown in FIG. 7B, a BPSG film (phosphorus containing insulating film) 45c made of a mixture of $SiO_2+P_2O_3+B_2O_3$ is formed on the substrate 206.

Figure 7C:
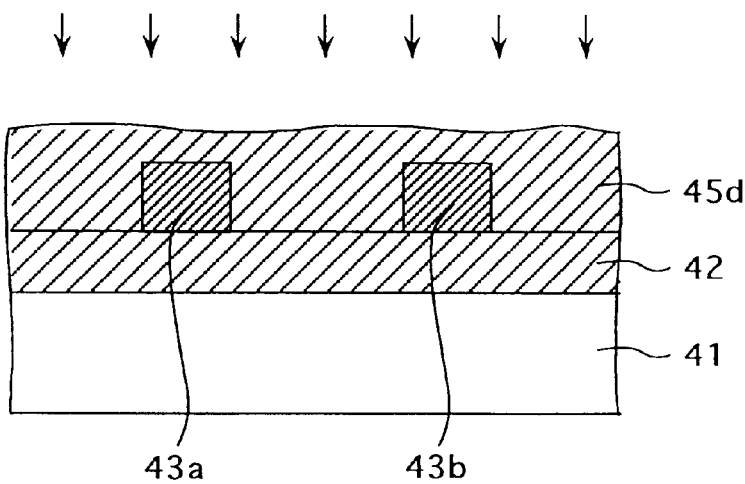

Then, as shown in FIG. 7C, a BPSG film 45d whose surface is planarized can be formed by heating the BPSG film 45c on the substrate 206 to be fluidized. At that time, like the first embodiment, the acceleration is applied to the substrate 206 simultaneously with the heating by rotating the substrate 206 or by applying the ultrasonic wave to the substrate 206, and thus fluidability of the substrate 206 can be advanced.

In this case, as in the first embodiment, the $P_2O_3$ density or the rate of $P_2O_3/P_2O_5$ can be controlled by adjusting the oxygen density, the substrate temperature, and the phosphorus containing compound or the boron containing compound. As a result, a melting point of the BPSG film 45c can be controlled between 200 to 500° C.

According to the film forming method of the second embodiment, like the film forming method in the first embodiment, fluidability of the BPSG film 45c can be enhanced even at the lower temperature by applying the acceleration in planarization, and therefore surface planarization can be maintained even when shrinkage of the BPSG film 45c is caused.

Consequently, it is possible to form the BPSG film (phosphorus containing insulating film) 45d which has the small hygroscopic property and the improved film quality and a surface of which is planarized.

Further, since fluidability of the PSG film 45a can be enhanced, the PSG film 45a can be filled in minute clearances on the substrate 206 without remaining the unfilled area. Therefore, generation of voids can be prevented.

Third Embodiment

A film forming equipment 302 employed to execute a method of forming the planarized PSG film, according to a third embodiment of the present invention will be explained with reference to FIG. 8 hereunder.

Figure 8:
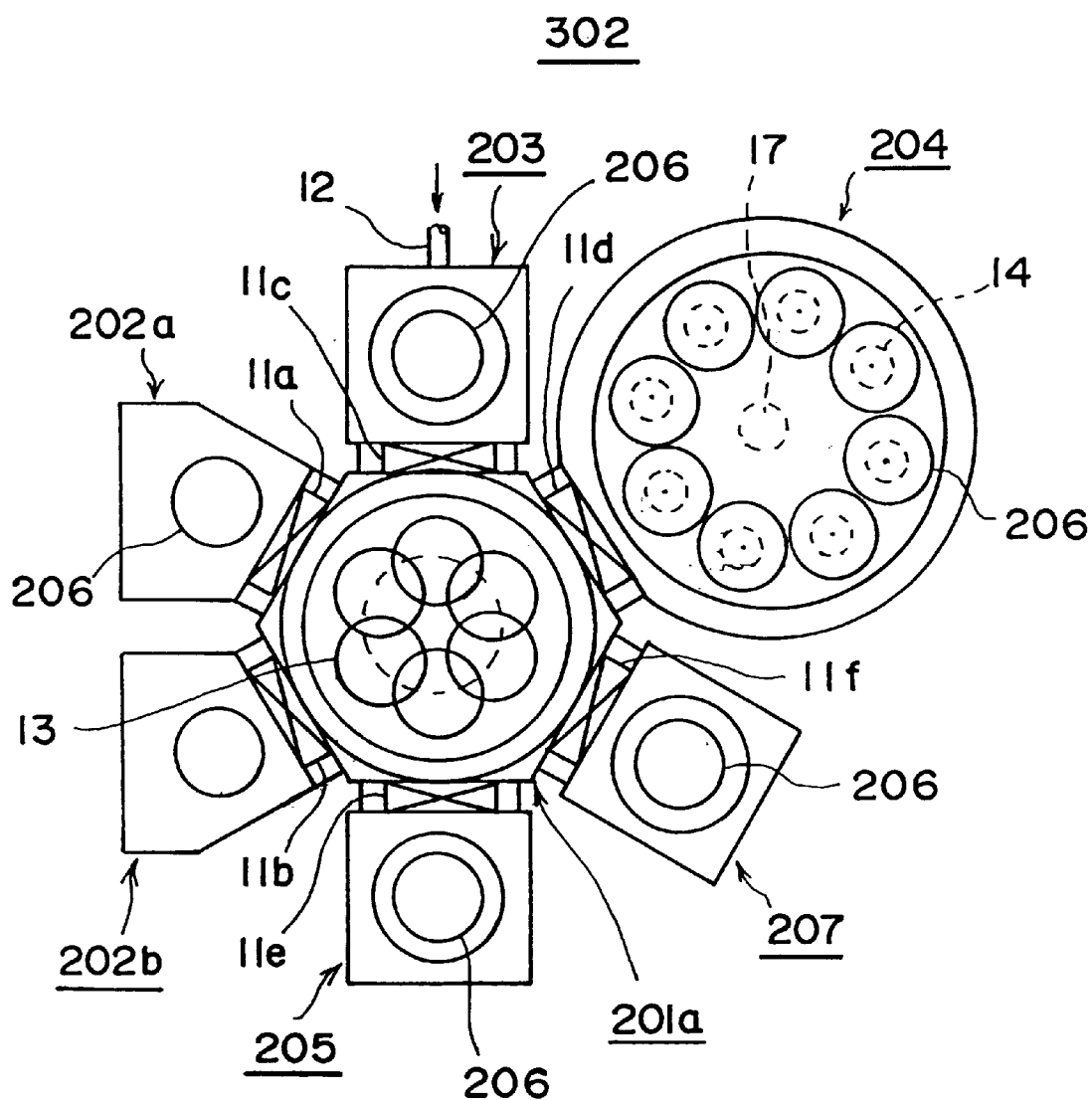
FIG. 8 is a top view showing a film forming equipment employed in a PSG film forming method according to a third embodiment of the present invention.

In the film forming equipment 302 employed in the third embodiment, a difference in configuration from the film forming equipment 302 according to the first embodiment resides in that, as shown in FIG. 8, a heating process chamber 207 is further connected to the transfer chamber 201 in addition to the load lock chambers 202a, 202b, the film forming chamber 203, the planarizing process chamber 204, and the substrate cooling chamber 205. This heating process chamber 207 is employed to heat the substrate 206 to sublimate $P_2O_3$ in the substrate 206 after the planarizing process.

The heating process chamber 207 is provided to keep the heating temperature of the substrate 206 at the temperature higher than the planarizing process temperature in order to sublimate $P_2O_3$ after the planarizing process has been effected at the low temperature.

Then, the film forming method using this film forming equipment 302 will be explained with reference to FIGS. 11A to 11D hereunder.

Figure 11A:
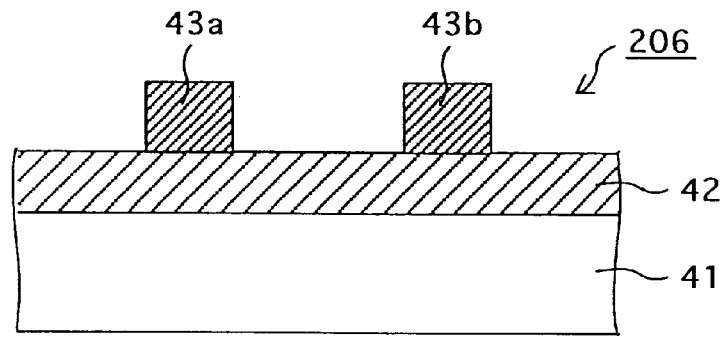
Figure 11B:
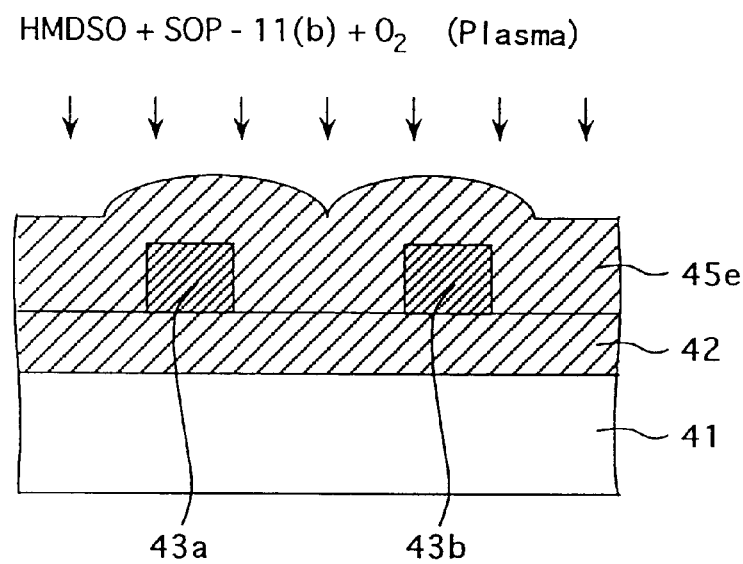

In this case, as shown in FIGS. 11A and 11B, a PSG film (phosphorus containing insulating film) 45e is formed by the plasma enhanced CVD method in the same way as in the first embodiment shown in FIGS. 6A and 6B. At this time, if the film forming gas containing the phosphorus containing compound which has III valence phosphorus and in which oxygen is bonded to at least one bond of the III valence phosphorus is employed, a great deal of $P_2O_3$ is contained in the formed PSG film (phosphorus containing insulating film) 45e.

Figure 11C:
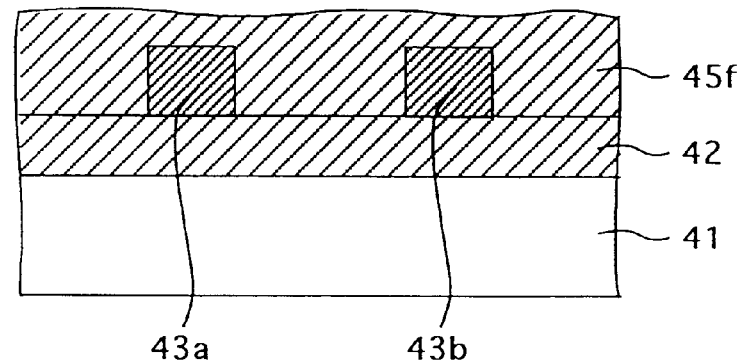

Then, as shown in FIG. 11C, the planarizing process of the PSG film 45e is carried out in the planarizing process chamber 204 at a temperature (B), which is higher than a melting temperature of the PSG film 45e but lower than a sublimation temperature in the first embodiment, for example, less than 700° C., preferably less than 500° C., to thus form a planarized PSG film (phosphorus containing insulating film) 45f. In this case, either the acceleration may be applied by rotating the PSG film 45e, etc., or the acceleration may not be applied. Though sufficient fluidability can be achieved even at the lower temperature by applying the acceleration, any case can be selected according to the situation.

Then, as shown in FIG. 11D, the substrate 206 is loaded into the heating process chamber 207. In turn, the substrate 206 is heated up to a temperature (A), which is higher than the temperature employed in the planarizing process, in the nitrogen ($N_2$) gas or argon (Ar) gas atmosphere to thus sublimate $P_2O_3$ in the PSG film 45f. As a result, a PSG film 45g a surface of which is planarized and whose film quality is improved can be formed.

Figure 9:
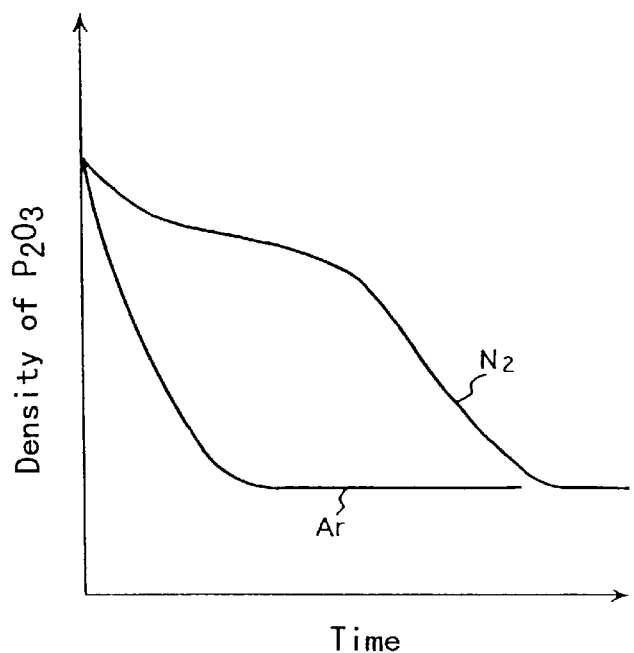
FIG. 9 is a graph showing a dependency of sublimation of $P_2O_3$ in the PSG film on an atmospheric gas in the film forming method according to the third embodiment of the present invention.

In this event, the care must be taken in using the nitrogen ($N_2$) gas or the argon (Ar) gas as the atmospheric gas to sublimate $P_2O_3$ because, as shown in FIG. 9, a different sublimation speed is given depending upon which one of the nitrogen ($N_2$) gas and the argon (Ar) gas is employed. The Ar gas can give the sublimation of $P_2O_3$ more quickly. In this case, since $P_2O_3$ is sublimated within about 15 minutes when the heating temperature of the substrate is set in the range of 250 to 650° C., the planarization process and subsequent heating process must be conducted quickly.

Figure 10:
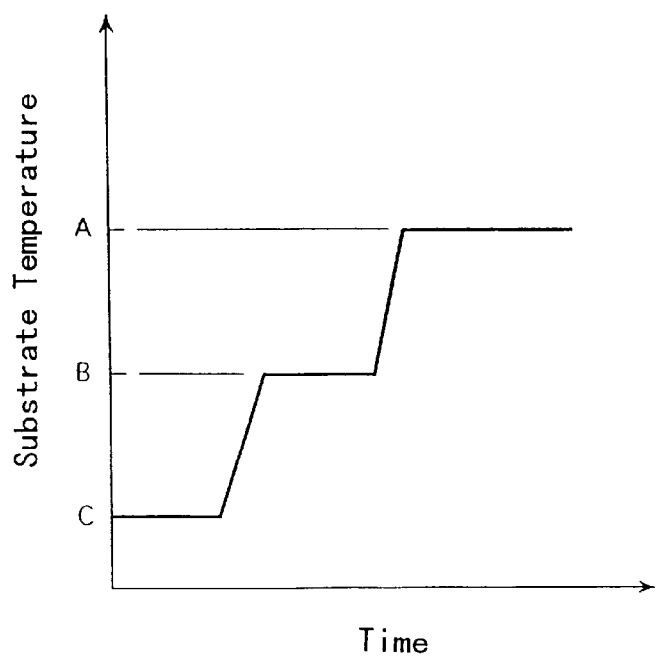
FIG. 10 is a graph showing a substrate annealing temperature in forming the PSG film in the film forming method according to the third embodiment of the present invention.

A series of heating steps constitute stepwise heating (step heating), as shown in FIG. 10. Following advantageous merits can be obtained by executing this step heating.

That is to say, shrinkage of the phosphorus containing insulating film is caused after the planarizing process because of the sublimation of $P_2O_3$ in heating in the planarizing process. Therefore, even if a surface of the insulating film is flat in the middle of the planarizing process, unevenness appears again on the surface of the insulating film after the planarizing process. At this time, if the heating temperature (B) in the planarizing process is set lower than the sublimation temperature (A) of $P_2O_3$ like the step heating in FIG. 10, a fluidized condition of the PSG film 45f can be maintained and thus a flat surface thereof can be still maintained continuously since an amount of sublimation of $P_2O_3$ is reduced during the planarizing process and thus the insulating film is in a low viscosity state.

Thereafter, if $P_2O_3$ is sublimated by heating the insulating film at the high temperature finally, fluidability of the PSG film (phosphorus containing insulating film) 45g is still maintained at its initial stage. Therefore, even if the film thickness is thinned due to shrinkage of the PSG film 45g, the flat surface of the PSG film can be maintained. Then, when $P_2O_3$ is reduced to a predetermined amount after the sublimation, the PSG film 45g is solidified while maintaining its flat surface state.

In this case, if there is a possibility that $P_2O_3$ still remains in the PSG film 45g after the PSG film 45g has been solidified, the heating process is carried out in the $N_2$ or Ar gas atmosphere in the heating process chamber 207 to sublimate $P_2O_3$ in the PSG film 45g and to solidify the PSG film 45g, and then the PSG film 45g is annealed in the same heating process chamber 207 after the $N_2$ or Ar gas has been exchanged with the $O_2$ gas. As a result, because $P_2O_3$ is changed into $P_2O_5$, such $P_2O_3$ causing the hygroscopic property can be removed more completely from the PSG film 45g, the film quality of the PSG film 45g can be improved much more.

As described above, according to the third embodiment, there are provided the step of heating the PSG film 45e while applying the acceleration to the PSG film 45e after the PSG film 45e has been formed, to thus fluidize the PSG film 45e and to planarize a surface of the PSG film 45e while the PSG film 45e has a predetermined viscosity, and the step of heating further the PSG film 45f after the PSG film 45f has been planarized, to thus sublimate $P_2O_3$ from the PSG film 45f and to solidify the PSG film 45g.

In the meanwhile, if the PSG film 45f is heated in planarization, $P_2O_3$ in the PSG film 45f is sublimated and thus reduced into a predetermined amount. As a result, shrinkage of the PSG film 45f is caused to generate the unevenness on the surface of the PSG film 45f. According to the present invention, fluidability of the PSG film 45f can be enhanced by applying the acceleration to the PSG film 45f during the planarizing process, so that the surface flatness of the PSG film 45f can be maintained even if such shrinkage of the PSG film 45f is caused.

As a consequence, it is possible to form the PSG film (phosphorus containing insulating film) 45g which has the small hygroscopic property and the improved film quality and the surface of which is planarized.

In addition, it is possible to perform the step heating by using the film forming equipment 302. Hence, since sublimation of $P_2O_3$ is gradually generated to suppress the solidification of the PSG film 45g, $P_2O_3$ having the hygroscopic property can be sublimated from the PSG film 45g while maintaining the planarization of the PSG film 45g.

Comparative Example

A comparative example with respect to the PSG film forming method according to the third embodiment of the present invention will be explained with reference to FIGS. 12A to 12C hereunder.

Figure 12A:
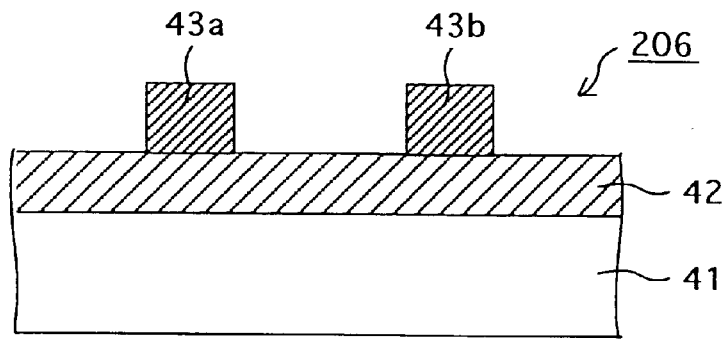
FIGS. 12A to 12C are sectional views showing a comparative example with respect to the PSG film forming method according to the third embodiment of the present invention.
Figure 12B:
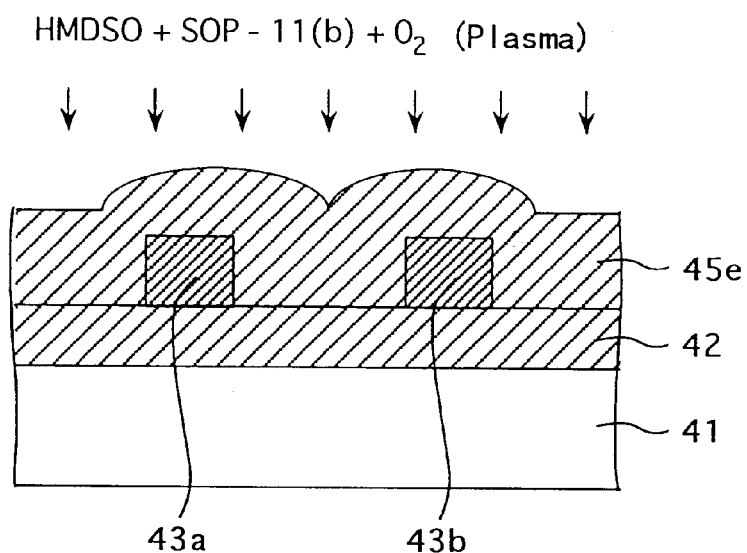

As shown in FIGS. 12A and 12B, the PSG film 45e is formed on the substrate 206 via the same steps as those in FIGS. 11A and 11B.

The PSG film 45e on the substrate 206 is then heated at the same temperature as the sublimation temperature in the third embodiment of the present invention, and thus the PSG film 45e can be fluidized to planarize its surface and also $P_2O_3$ can be sublimated.

Figure 12C:
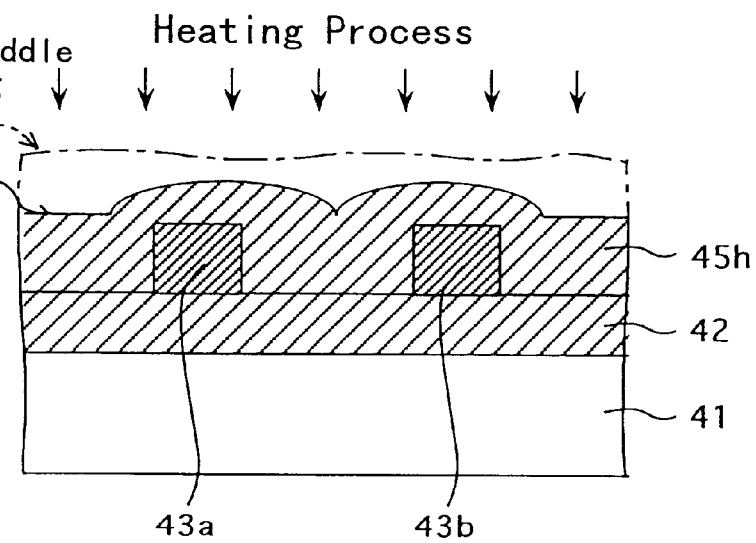

At this time, since $P_2O_3$ is sublimated abruptly and the solidification of a PSG film 45h is caused abruptly, shrinkage of the PSG film 45h is caused because of the sublimation of $P_2O_3$, and thus the film thickness is thinned and also unevenness of the surface of the PSG film 45h is generated, as shown in FIG. 12C.

On the contrary, in the case of the third embodiment of the present invention, since the sublimation of $P_2O_3$ is caused gradually by using the step heating to thus suppress the solidification of the PSG film, the planarized surface of the PSG film can be still maintained.

With the above, the film forming method according to the present invention has been discussed with reference to particular embodiments, but the present invention is not limited to these embodiments. Various modifications or variations such as mere changes in design which are applied to the above embodiments by the person skilled in the art are included in the scope of the present invention.

For example, although the film is formed by the plasma enhanced CVD method in the above first and third embodiments, such film can also be formed by the thermal CVD method. In this case, it is preferable that the substrate 206 is heated, at the temperature of less than 400° C.

Also, the SOP-11(b) is employed as the phosphorus-containing compound, but other phosphorus-containing compound which has been explained in the first embodiment may be employed if such compound which has the III valence phosphorus and in which oxygen is bonded to at least one bond of the III valence phosphorus is utilized.

In addition, the HMDSO is employed as the silicon-containing compound, but other silicon-containing compound which has been explained in the first embodiment may be employed.

Further, the oxygen is employed as the oxidizing gas, other oxidizing gas which has been explained in the first embodiment may be employed, otherwise no oxidizing gas may be added.

Further, the $N_2$ or Ar gas is employed as the carrier gas, but the He gas may be employed.

Further, aluminum is employed as material of the wiring layers 43a, 43b on the substrate 206, but aluminum alloy, copper, refractory metal or its nitrogen compound, polysilicon, or the like may be employed instead of aluminum.

In addition, the rotating means and the ultrasonic applying means are employed as the acceleration applying means, but other acceleration applying means, e.g., means for applying the vibration in the vertical direction, means for applying the vibration in the planar surface direction, means for applying the acceleration in the planar surface direction, or means for applying the acceleration in the vertical direction may be employed to accelerate the fluidability of the phosphorus containing insulating film.

As discussed above, in the present invention, there are provided the step of heating the phosphorus containing insulating film while applying the acceleration to the phosphorus containing insulating film to fluidize and thus planarize the phosphorus containing insulating film while the phosphorus containing insulating film has a predetermined viscosity after the phosphorus containing insulating film has been formed, and the step of further heating the phosphorus containing insulating film to sublimate $P_2O_3$ in the phosphorus containing insulating film and thus solidify the phosphorus containing insulating film after the phosphorus containing insulating film has been planarized.

Even when shrinkage of the phosphorus containing insulating film is caused due to sublimation of $P_2O_3$ occurring by heating the phosphorus containing insulating film during the planarization, the fluidability of the phosphorus containing insulating film can be enhanced by applying the acceleration in planarization and therefore. the planarized surface of the phosphorus containing insulating film can be maintained.

Thus, it is possible to form the phosphorus containing insulating film which has the small hygroscopic property and the improved film quality and the surface of which is planarized.

Further, since the fluidability of the phosphorus containing insulating film can be enhanced, the phosphorus containing insulating film can be filled in minute clearances on the substrate without remaining the unfilled area. Therefore, the voids can be prevented from being generated and also the film quality can be improved.

In particular, since the planarizing process temperature is set lower than the sublimation process temperature and also the so-called stepwise heating (step heating) is adopted as a series of heating operations ranging from the planarizing process to the film quality improvement, the planarization of the phosphorus containing insulating film can be maintained continuously by reducing an amount of $P_2O_3$ sublimated from the formed phosphorus containing insulating film in planarization to thus keep its low viscosity state and to hold its fluidized state. Therefore, since the fluidability of the phosphorus containing insulating film can still be maintained at the initial stage of the heating process to sublimate $P_2O_3$, the flat surface can be held even when the film thickness is reduced because of shrinkage of the phosphorus containing insulating film.

As a result, $P_2O_3$ which causes hygroscopic property can be sublimated from the phosphorus containing insulating film while maintaining the planarization of the phosphorus containing insulating film, so that it is feasible to form the phosphorus-containing insulating film which has small hygroscopic property and improved film quality and the surface of which is planarized.

What is claimed is:

1. A film forming method comprising the steps of:
    forming on a substrate, a phosphorus-containing insulating film which contains $P_2O_3$ by using a film forming gas in which an oxidizing gas is added into a gas mixture including silicon-containing compound and phosphorus-containing compound which has III valence phosphorus and oxygen bonded to at least one bond of said III valence phosphorus, or by using said film forming gas from which said oxidizing gas is removed;

heating said phosphorus-containing insulating film while applying acceleration to said phosphorus-containing insulating film to fluidize said phosphorus-containing insulating film and thus planarize a surface of said phosphorus-containing insulating film while said phosphorus-containing insulating film has a predetermined viscosity; and heating further said phosphorus-containing insulating film after the surface of said phosphorus-containing insulating film has been planarized, to sublimate $P_2O_3$ in said phosphorus-containing insulating film and thus solidify said phosphorus-containing insulating film.

2. A film forming method according to claim 1, wherein a way of applying the acceleration to said phosphorus-containing insulating film is that the acceleration is applied to said phosphorus-containing insulating film along a direction parallel with a surface of said substrate by rotating said substrate.

3. A film forming method according to claim 1, wherein a way of applying the acceleration to said phosphorus-containing insulating film is that the acceleration generated in perpendicular to or parallel with a surface of said substrate is applied to said phosphorus-containing insulating film by vibrating said substrate along a direction perpendicular to or parallel with the surface of said substrate.

4. A film forming method according to claim 1, wherein a way of applying the acceleration to said phosphorus-containing insulating film is that ultrasonic waves are irradiated to said substrate.

5. A film forming method according to claim 1, wherein a temperature at which a surface of said phosphorus-containing insulating film is planarized by heating said phosphorus-containing insulating film to fluidize is set lower than a temperature at which said phosphorus-containing insulating film is solidified by heating said phosphorus-containing insulating film to sublimate $P_2O_3$ in said phosphorus-containing insulating film.

6. A film forming method comprising the steps of:

forming on a substrate, a phosphorus-containing insulating film which contains $P_2O_3$ by using a film forming gas in which an oxidizing gas is added into a gas mixture including silicon-containing compound and phosphorus-containing compound which has III valence phosphorus and oxygen bonded to at least one bond of said III valence phosphorus, or by using said film forming gas from which said oxidizing gas is removed;

heating said phosphorus-containing insulating film to fluidize said phosphorus-containing insulating film and thus planarize a surface of said phosphorus-containing insulating film while said phosphorus-containing insulating film has a predetermined viscosity; and heating further said phosphorus-containing insulating film at a temperature, which is higher than a temperature used to planarize the surface of said phosphorus-containing insulating film, after the surface of said phosphorus-containing insulating film has been planarized, to sublimate $P_2O_3$ in said phosphorus-containing insulating film and thus solidify said phosphorus-containing insulating film.

7. A film forming method according to claim 1, wherein a temperature at which said phosphorus-containing insulating film is heated to planarize the surface of said phosphorus-containing insulating film is set to less than 700° C. or less than 500° C.

8. A film forming method according to claim 1, wherein said phosphorus-containing compound which has III valence phosphorus and oxygen bonded to at least one bond of said III valence phosphorus is composed of TMP (Trimethylphosphite ($P(OCH_3)_3$)) whose constitutional formula is given by

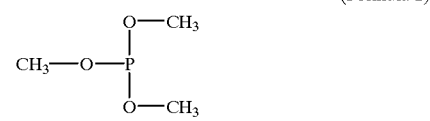

(Formula 1)

or a phosphorus-containing compound which has a Si—O—P structure whose constitutional formula is given by

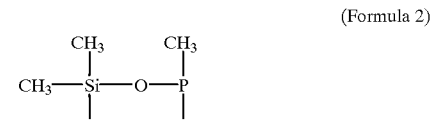

(Formula 2)

or

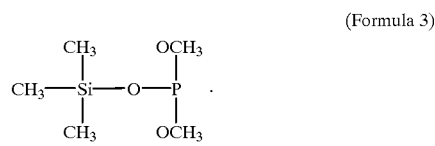

(Formula 3)

9. A film forming method according to claim 1, wherein the silicon-containing compound is composed of alkylsilane or allylsilane (general formula: $R_nSiH_{4-n}$ (n=1 to 4)), alkoxysilane (general formula: $(RO)_nSiH_{4-n}$ (n=1 to 4)), chain siloxane (general formula: $R_nH_{3-n}SiO(R_kH_{2-k}SiO)_mSiH_{3-n}R_n$ (n=1 to 3; k=0 to 2; m≧0)), derivative of chain siloxane (general formula: $(RO)_nH_{3-n}SiOSiH_{3-n}(OR)_n$ (n=1 to 3)), or ring siloxane (general formula: $(R_kH_{2-k}SiO)_m$ (k=1, 2; m≧0)) (where R is alkyl radical, allyl radical, or their derivative).

10. A film forming method according to claim 1, wherein said oxidizing gas is composed of any one of ozone ($O_3$), oxygen ($O_2$), NO, $N_2O$, $NO_2$, CO, $CO_2$, and $H_2O$.

11. A film forming method according to claim 8, wherein said film forming gas is composed of a gas in which no oxidizing gas is added into a gas mixture of the phosphorus-containing compound and hexamethyldisiloxane (($CH_3$)$_3SiOSi(CH_3)_3$) as said silicon-containing compound, or a gas in which oxygen ($O_2$) as the oxidizing gas is added into said gas mixture of said phosphorus-containing compound and said hexamethyldisiloxane (($CH_3$)$_3SiOSi(CH_3)_3$).

12. A film forming method according to claim 1, wherein said film forming gas is activated by using heating or plasmanization.

13. A film forming method according to claim 12, wherein said substrate is heated at a temperature of less than 400° C. during film formation.

14. A film forming method according to claim 1, wherein said phosphorus-containing insulating film which contains $P_2O_3$ is composed of either a phosphosilicate glass (PSG) film or a borophosphosilicate glass (BPSG) film.

15. A film forming method according to claim 1, further comprising the step of:

heating said phosphorus-containing insulating film in an oxygen-containing atmosphere to change $P_2O_3$ which is left in said phosphorus-containing insulating film into $P_2O_5$ after said phosphorus-containing insulating film has been solidified by heating said phosphorus-containing insulating film to sublimate $P_2O_3$ in said phosphorus-containing insulating film.

16. A film forming method comprising the steps of:

forming wiring layers on an insulating film;

forming a phosphorus-containing insulating film which contains $P_2O_3$ so as to cover said wiring layers formed on said insulating film, said phosphorus-containing insulating film formed by using a film forming gas in which an oxidizing gas is added into a gas mixture including silicon-containing compound and phosphorus-containing compound which has III valence phosphorus and oxygen bonded to at least one bond of the III valence phosphorus, or by using said film forming gas from which the oxidizing gas is removed;

heating said phosphorus-containing insulating film while applying acceleration to said phosphorus-containing insulating film to fluidize said phosphorus-containing insulating film and thus planarize a surface of said phosphorus-containing insulating film while said phosphorus-containing insulating film has a predetermined viscosity; and heating further said phosphorus-containing insulating film after the surface of said phosphorus-containing insulating film has been planarized, to sublimate $P_2O_3$ in said phosphorus-containing insulating film and thus solidify said phosphorus-containing insulating film.

17. A film forming method according to claim 16, wherein material of said wiring layers consists of aluminum, aluminum alloy, copper, refractory metal or its nitrogen compound, or polysilicon.

* * * * *

UNITED STATES PATENT AND TRADEMARK OFFICE
CERTIFICATE OF CORRECTION

PATENT NO. : 6,110,814
DATED : August 29, 2000
INVENTOR(S) : Tokumasu et al.

It is certified that error appears in the above-identified patent and that said Letters Patent is hereby corrected as shown below:

Title page,
Insert the Heading, -- FOREIGN PATENT DOCUMENTS

EP 0 840 366 A3    05/06/98    EP 2 307 344    05/21/97 --.

Column 8,
Line 17, "202aby" should read -- 202a by --.

Signed and Sealed this

Eighth Day of January, 2002

*Attest:*

JAMES E. ROGAN
*Attesting Officer*    *Director of the United States Patent and Trademark Office*